United States Patent
Hamby et al.

(10) Patent No.: US 8,022,626 B2
(45) Date of Patent: Sep. 20, 2011

(54) LIGHTING MODULE

(75) Inventors: David Hamby, Andover, MA (US); Adam M. Scotch, Amesbury, MA (US); John Selverian, North Reading, MA (US)

(73) Assignee: Osram Sylvania Inc., Danvers, MA (US)

( * ) Notice: Subject to any disclaimer, the term of this patent is extended or adjusted under 35 U.S.C. 154(b) by 418 days.

(21) Appl. No.: 12/211,359

(22) Filed: Sep. 16, 2008

(65) Prior Publication Data

US 2010/0066229 A1 Mar. 18, 2010

(51) Int. Cl.
*B60Q 1/00* (2006.01)

(52) U.S. Cl. ............ 313/512; 313/1; 362/227; 362/241; 443/23

(58) Field of Classification Search .............. 313/1, 512; 445/23; 362/227, 241
See application file for complete search history.

(56) References Cited

U.S. PATENT DOCUMENTS

| | | | |
|---|---|---|---|
| 6,132,072 A | 10/2000 | Turnbull et al. | |
| 6,917,057 B2 | 7/2005 | Stokes et al. | |
| 6,974,229 B2 | 12/2005 | West et al. | |
| 7,176,502 B2 | 2/2007 | Mazzochette et al. | |
| 7,224,000 B2 | 5/2007 | Aanegola et al. | |
| 7,259,403 B2 | 8/2007 | Shimizu et al. | |
| 7,309,151 B2 | 12/2007 | Mok et al. | |
| 7,407,316 B2 | 8/2008 | Noh et al. | |
| 7,815,343 B2 | 10/2010 | Nii et al. | |
| 2003/0141510 A1 | 7/2003 | Brunner et al. | |
| 2003/0189829 A1* | 10/2003 | Shimizu et al. | 362/240 |
| 2003/0193789 A1 | 10/2003 | Karlicek, Jr. | |
| 2005/0007516 A1 | 1/2005 | Hong et al. | |
| 2005/0173721 A1 | 8/2005 | Isoda | |
| 2005/0237747 A1* | 10/2005 | Shimizu et al. | 362/294 |
| 2005/0281030 A1* | 12/2005 | Leong et al. | 362/234 |
| 2006/0076571 A1 | 4/2006 | Hsieh et al. | |
| 2006/0151809 A1 | 7/2006 | Isokawa | |
| 2006/0163587 A1 | 7/2006 | Erchak et al. | |
| 2006/0181878 A1 | 8/2006 | Burkholder | |
| 2007/0109807 A1* | 5/2007 | Lynam et al. | 362/545 |
| 2007/0278512 A1 | 12/2007 | Loh et al. | |
| 2008/0048200 A1 | 2/2008 | Mueller et al. | |
| 2008/0076198 A1 | 3/2008 | Park et al. | |
| 2008/0099777 A1 | 5/2008 | Erchak et al. | |
| 2008/0106186 A1 | 5/2008 | Ishii et al. | |
| 2008/0170846 A1 | 7/2008 | Wang | |

(Continued)

FOREIGN PATENT DOCUMENTS

EP 1691425 8/2006

(Continued)

OTHER PUBLICATIONS

American Bright LED, Press Release (Jun. 13, 2008).

(Continued)

*Primary Examiner* — Toan Ton
*Assistant Examiner* — Fatima Farokhrooz
(74) *Attorney, Agent, or Firm* — Robert F. Clark

(57) ABSTRACT

A lighting module comprising a base panel and a plurality of light-emitting diode (LED) chips attached directly to the base panel. The LED chips are in electrical communication with conductive traces on the base panel, which deliver a current to the LED chips. Various embodiments of this generally described lighting module are also presented. Additionally, methods of preparing such a lighting module, and system components of the lighting module are presented.

30 Claims, 16 Drawing Sheets

U.S. PATENT DOCUMENTS

2008/0179609 A1 7/2008 Trottier et al.
2008/0244944 A1* 10/2008 Nall et al. .................... 40/544

FOREIGN PATENT DOCUMENTS

| | | |
|---|---|---|
| JP | 2005-039194 | 2/2005 |
| JP | 2006-351351 | 12/2006 |
| JP | 2007-080666 | 3/2007 |
| KR | 2004-0009818 | 12/2004 |
| KR | 2007-0101856 | 10/2007 |
| WO | WO 2005/022654 | 3/2005 |
| WO | WO 2007/075143 | 7/2007 |

OTHER PUBLICATIONS

Abstract, JP 2006-351351 (Dec. 28, 2006).
Abstract JP2005-039194.
GE Lumination Vio Device, Data Sheet, available at least as early as Sep. 12, 2008.
Alder Lightfield System, Product Sheet, available at least as early as Feb. 4, 2008.
OSTAR (4 chip) Model: LE W E2B, Data Sheet (Feb. 11, 2008).
OSTAR (6 chip) Model: LE UW E3B, Data Sheet (Feb. 11, 2008).
Press release titled, Sharp to Introduce Oblong and Square LED Lightings (Aug. 4, 2008).
TiLux™, Solid-State Lighting Solutions Outlast, Outperform and Deliver Lower Cost of Ownership Than Fluorescent Lamps, greenTECHZONE Products for the week of Feb. 12, 2007.
Cree EZR260 LED, Product Sheet (2006).
PaneLux™, LED folio corporation, available at least as early as Sep. 12, 2008.
LinearLux™, LED folio corporation, available at least as early as Sep. 12, 2008.
Lamina® Titan™ Series LED Lighting Systems, Data Sheet and Technical Specifications (May 21, 2008).
LITE PANELS™ Product line, including Litepanels™ 1x1, Litepanels™ MiniPlus, Ringlite™ Cinema, Litepanels™ MiniPlus Infrared (IR), Ringlite™ Mini, available at least as early as Sep. 12, 2008.
Abstract, KR 2004-0009818 (Dec. 3, 2004).
Abstract JP 2007-080666 (Mar. 29, 2007).

* cited by examiner

LIGHTING MODULE

BACKGROUND OF THE INVENTION

1. Field of the Invention

The present invention is directed to lighting modules. More specifically, the present invention is directed to lighting modules comprising light-emitting diode chips.

2. Background

A light-emitting diode (LED) is a semiconductor device that emits light when excited by electrical energy. In general, an LED comprises an LED chip disposed within a package. The LED chip is a semiconducting material (or combination of materials) impregnated, or doped, with impurities to create a p-n junction. When electrical current is passed through the LED chip in a forward-bias, electrons "jump" across the p-n junction and emit light. The package is usually a plastic or ceramic material having electrical connections to couple the LED chip to a current source. The main disadvantage of an LED package is that the thermal resistance of the package can be quite large (i.e., greater than 100° C./W), which degrades the life and performance of the LED chip. The terms "light-emitting diode chip," "LED chip," "chip," or "LED die" are used to refer to the semiconducting p-n junction, and thereby differentiate from the term LED, which generally includes both a chip and its packaging.

LEDs are more efficient light sources than incandescent light sources. However, one challenge with using LEDs as light sources for general lighting applications is in obtaining sufficient light out of an individual LED chip. In other words, an individual LED chip does not provide enough light as compared to other light sources such as, for example, tungsten filaments. However, when several LEDs are combined into an array of LEDs, the combination and cumulative effect of all the LED chips in the array produce a light source with sufficient light.

LEDs are seeing increased use in lighting applications. Early uses of LEDs in lighting fixtures have tended to employ high-power LEDs (typically, 1W chips) grouped together in what is generally referred to as a lighting module. One or more lighting modules may then be employed in a lighting fixture. In order to create a uniform light source, the LEDs must be placed close enough to "blend" light through a diffuser. Additionally, there is an increased demand to minimize the thickness of light fixtures, requiring the LEDs to be placed even closer together. As the LEDs are moved closer together, there is an increased need for exotic thermal management solutions (e.g., fans, cooling fins, heat pipes, etc.).

In addition to heating issues, lighting modules using LEDs must be designed to address optical issues such as color uniformity and binning. For example, depending on the semiconducting material used, LED chips can deliver light of different colors. In order to produce white light, two techniques are generally employed. In one technique, three LED chips (one red, one blue, and one green) are bundled together such that the cumulative output results in a white light source. The second technique employs a UV/blue LED chip coated or packaged with a phosphor. The LED chip emits light of a specific wavelength (in the UV or blue region). The emitted light excites the phosphor, which results in the emission of white light. However, when LED chips are manufactured, a single semiconducting wafer can produce LED chips of varying wavelengths. LED chip manufacturers must then employ an expensive binning procedure to organize (or bin) the LED chips by wavelength. In order to ensure uniformity, a manufacturer of LED lighting modules would require LED chips from a small range of bins. Such a limitation adds to the production costs of the lighting module.

BRIEF SUMMARY OF THE INVENTION

Presented herein are lighting modules which generally comprise a base panel and a plurality of light-emitting diode (LED) chips attached directly to a base panel. Various embodiments of this general concept are presented. Additionally, methods of preparing a lighting module, and system components of a lighting module are presented.

BRIEF DESCRIPTION OF THE FIGURES

The accompanying figures, which are incorporated herein and form part of the specification, illustrate embodiments of the present invention. Together with the description provided, the figures serve to explain the principles of the present invention and thereby enable a person skilled in the pertinent art to make and use the present invention.

DETAILED DESCRIPTION

Presented herein are lighting modules which generally comprise a base panel and a plurality of light-emitting diode (LED) chips attached directly to the base panel. Various embodiments of this general concept are presented. Additionally, methods of preparing a lighting module, and system components of a lighting module are presented. The embodiments provided are described with reference to the figures, where like reference numbers generally indicate identical or functionally similar elements. Also, the left most digit of each reference number generally corresponds to the figure in which the reference number is first used. While specific configurations and arrangements are discussed, it should be understood that this is done for illustrative purposes only. A person skilled in the relevant art will recognize that other configurations and arrangements can be used without departing from the spirit and scope of the appended claims.

Figure 1:
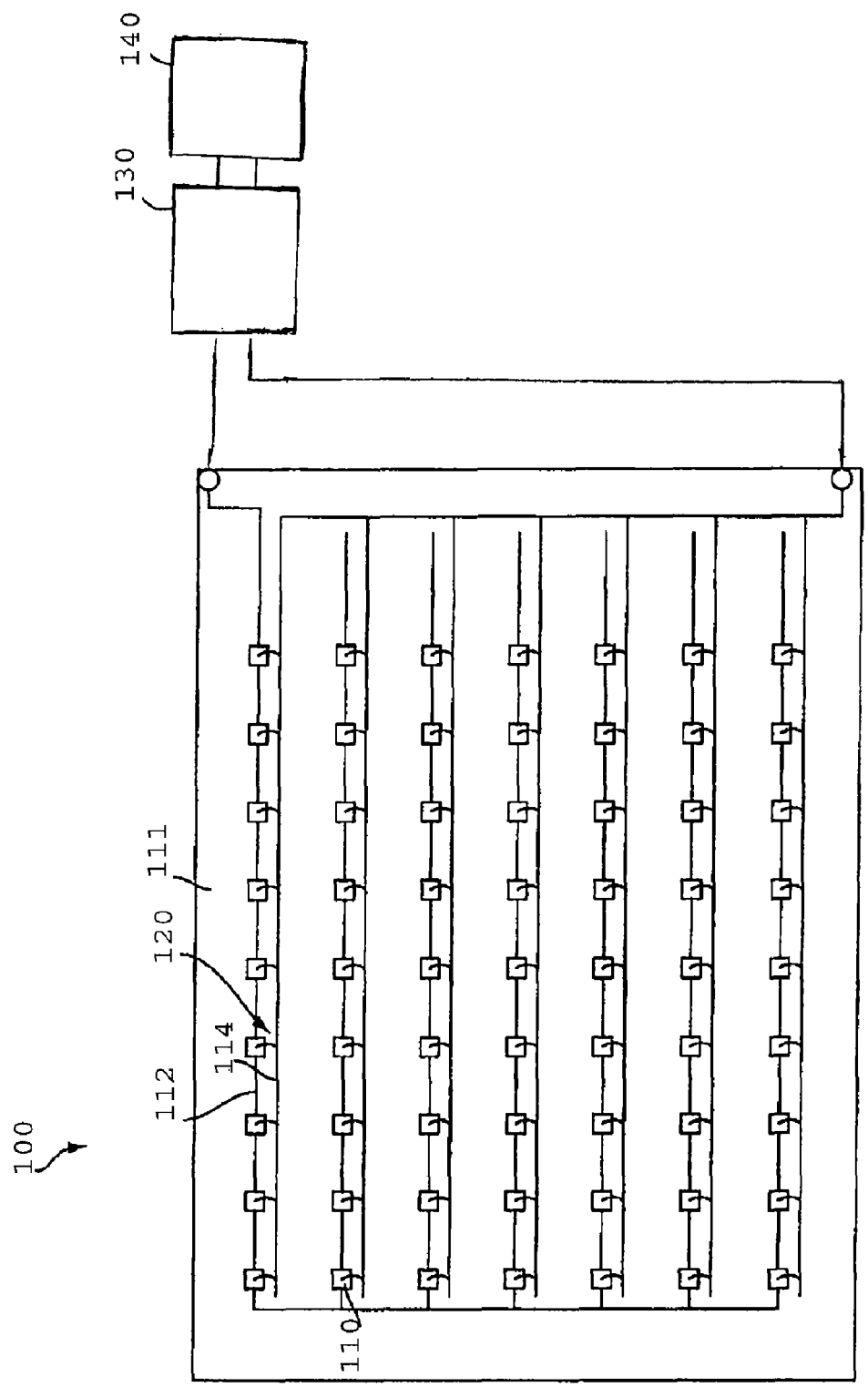
FIG. 1 is a schematic view of a lighting module in accordance with one embodiment.

FIG. 1 is a schematic view of a lighting module 100 in accordance with one embodiment presented herein. Lighting module 100 includes an array of LED chips 110 disposed on a substrate, or base panel 111. LED chips 110 are attached directly to base panel 111. As used herein, the terms "attached directly" or "directly attached" are intended to broadly refer to the adhesion or otherwise attachment of the LED chip to a substrate without underlying packaging. In one embodiment, LED chips 110 are adhered to base panel 111 using an Ag-filled glue. Other techniques may be used to directly attach LED chips 110 to base panel 111. For example, LED chips 110 may be directly attached to base panel 111 using eutectic soldering.

In the embodiment shown, LED chips 110 are electrically coupled to first and second conductive traces 112 and 114 in a parallel circuit. While LED chips 110 are shown in a parallel circuit, one of skill in the art would readily know how to arrange the LED chips 110 in an equivalent serial circuit. As shown in FIG. 1, LED chips 110 are directly attached to base panel 111 in contact with first conductive trace 112 and electrically coupled to second conductive trace 114 by a wire bond 120. First and second conductive traces 112, 114 are then coupled to a current regulator 130, which receives power from a power supply 140. Power supply 140 is typically an AC power supply. The AC power from power supply 140 is then converted to DC current at current regulator 130. One of skill in the art would understand that the term "power source" used herein is intended to broadly refer to any means for delivering the necessary current or voltage to the LED chips. As such, an appropriate power source may be a single DC power supply, or an AC power supply in combination with a AC/DC converter and/or current regulator.

Current regulator 130, power supply 140, and conductive traces 112, 114, and equivalent structures, serve as means for delivering a de-rated current to LED chips 110 by capping the amount of current delivered to lighting module 100 and providing a reliable, low-noise current. In one embodiment, for example, current regulator 130 is designed to provide current as low as 0.050 Amperes with a noise variation of no more than about 0.010 Amperes. Alternative equivalent structures may be employed with the end result of creating a circuit having a plurality of LED chips 110 electrically coupled to cathode/anode connections of a power source.

LED chips 110 are generally small, low-power LED chips. For example, LED chips 110 may be as small as about 260 μm wide by about 450 μm long, and have a rated current of about 20 mA, with a forward voltage of about 3.2V. In an alternative embodiment, LED chips 110 may be as large as about 500 μm wide by about 500 μm long, and have a rated current of about 88 mA, and a forward voltage of about 3.2V.

In one embodiment, base panel 111 is a printed circuit board (PCB) with conductive traces 112 and 114. As would be known to one of skill in the art, various substrates may be employed as means for maintaining a plurality of LED chips. The choice of substrate material depends in part on the required properties of the lighting module, and more specifically on the structural requirements of the lighting application and/or lighting fixture that will house the lighting module. For example, one lighting application may require an electrically-insulative ceramic substrate, while an alternative lighting application may require a thermally-conductive metallic or ceramic substrate. Further, the thickness of the substrate may be adjusted for the specific application. Example substrates include aluminum foil, anodized aluminum, a metal clad printed circuit board, aluminum nitride, and various other metallic or ceramic substrates. Alternative embodiments include coatings on the substrate. For example, in one embodiment the substrate may be formed of anodized aluminum with a dielectric layer coated on top. The dielectric layer may be an anodized layer of $Al_2O_3$. In an alternative embodiment, the substrate may be coated with a polymer dielectric. The polymer dielectric may be silicone filled with a ceramic particles, such as $Al_2O_3$, $SiO_2$, or $TiO_2$. In another embodiment, the substrate may be coated with a $TiO_2$-embedded silicone.

In one embodiment, base panel 111 is populated with LED chips 110 in accordance with a specific pack-density. Contrary to commonly used LED lighting modules, which tend to use a small number of high-power packaged LEDs, the lighting module presented herein addresses thermal and optical issues by employing a relatively large number of low-power LED chips. The LED chips are attached directly to a base panel and powered by delivering a "de-rated" current to the LED chips. The de-rating of the chips thereby maintains a generally lower overall operating temperature and increases the output efficiency of the individual chips.

The pack-density of lighting module 100 takes into consideration that there is a limit to the heat input for a given area (and temperature rise) when only convection and radiation are considered as heat loss mechanisms. In other words, base panel 111 may be populated with LED chips 110 as a function of maximum heat flux, or heat input per unit area. In one embodiment, for example, the pack-density is in accordance with the following mathematical relationship:

$$(Q/A)_{MAX} = \sigma \varepsilon (T_b^4 - T_o^4) + h_{air}(T_b - T_o)$$

Such equation balances heat input per unit area (Q/A) on the left-hand side, with radiation and convection on the right-hand side, for a maximum board temperature ($T_b$) of, for example, 60° C. and a constant ambient temperature ($T_o$) of, for example, 20° C. In the radiation portion of the equation, the symbols are σ (Stefan-Boltzmann constant) and (emissivity, which is constant and arbitrarily assumed to be 0.5; or set to 1 for a blackbody). In the convection portion of the equation, the symbol $h_{air}$ is the convection coefficient and is assumed constant and is arbitrarily chosen to be 15 W/m²K (but may vary from 10-100 W/m²K).

The above analysis is merely an example as it is oversimplified and relies on arbitrary values for emissivity and convection coefficients. However, the above analysis allows for an estimate of a maximum heat input per unit area as a design guide. For example, the heat input per unit area (Q/A) may be about 0.5 W/in². In alternative embodiments, the heat input per unit area (Q/A) may range from about 0.1 W/in² to about 0.7 W/in². This estimate then "fixes" the maximum number of chips per unit area, if they are driven at their rated current. By using smaller chips and decreasing the drive current for each of the chips, more chips can be placed in a given area without an increased board temperature. For example, a typical 1 mm "high-power" chip operates at a rated forward current of 350 mA with a forward voltage ($V_f$) of about 3.2V, resulting in an input power of 1.12W. Typically, 1 mm chips are about 20% efficient at this forward current, so about 0.9W must be dissipated as heat. From the above analysis, this chip requires about 1.8 in² to dissipate the heat by convection and radiation and thereby limit the board temperature to about 60° C. (As an aside, there is an additional temperature rise of about 10-20° C. from the board to the LED chip, so the actual temperature of the chip (referred to as the junction temperature ($T_j$)) rises to about 70-80° C.) As such, the pack-density for the 1 mm chip is about one chip per 1.8 in². Using 0.5 mm "low-power" chips, and de-rating the forward current to about 45 mA, results in a heat input per chip of about 0.14W. Using low-power chips increases the allowable pack-density to about four chips per square inch. The net effect is a lighting module with more individual light sources (eight chips for every two square inches versus one chip for every two square inches). Further, such a lighting module does not require auxiliary heat sinking techniques.

Figure 13:
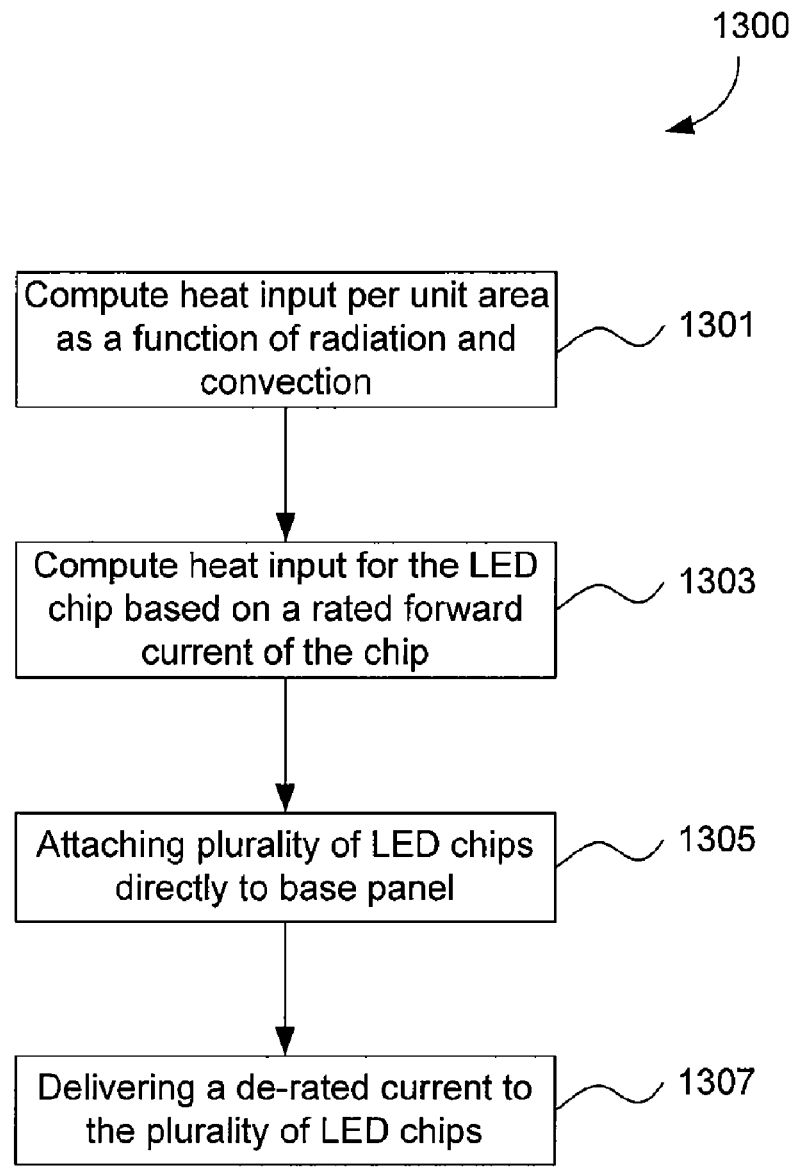
FIG. 13 illustrates a method of preparing a lighting module.

The above analysis may be employed in, for example, the method provided in FIG. 13. FIG. 13 illustrates a method 1300 of preparing a lighting module having a base panel and a plurality of LED chips, wherein the lighting module is designed to have an operational temperature below 60° C. Method 1300 begins with step 1301 wherein heat input per unit area is computed as a function of radiation and convection. In step 1303, heat input for the LED chips is computed based on a rated forward current of the LED chips. In step 1305, the LED chips are attached directly to the base panel. In step 1307, a de-rated current is delivered to the plurality of chips.

In an alternative embodiment, base panel 111 is populated with LED chips 110 in accordance with a specific lumens-density metric. As used herein, "lumens-density metric" is abbreviated "LD" and is defined as:

$$LD = (A_b/A_h)(A_b/A_{em})(L/A_{em})(LPW)$$

wherein $A_b$ is the area of the base panel, $A_h$ is the total convection area, $A_{em}$ is the emitting area (i.e, the size of the chip times the total number of chips), L is lumens, and LPW is lumens per Watt. In one exemplary embodiment, there is provided a lighting module having twenty-five LED chips attached directly to a base panel of about four inches by four inches. Each LED chip is about 500 μm by 500 μm, has a forward voltage of about 3.2+/−0.3 Volts, and a rated current of about 0.080+/−0.010 Amperes. Such lighting module is estimated to have a LD of about $2.9 \times 10^6$ lumens squared per area watt ($lm^2/mm^2 W$). In contrast, the inventors have estimated that prior art lighting modules have an LD of less than about $1.0 \times 10^6$ $\mu lm^2/mm^2 W$. For example, LCD backlighting modules are estimated to have an LD of about $7.0 \times 10^5 - 8.1 \times 10^5$ $lm^2/mm^2 W$. The OSTAR®LE W E3B, lighting module sold by OSRAM Opto Semiconductors GmbH, has an estimated LD of about $1,500$ $lm^2/mm^2 W$. For comparison purposes, the chart below outlines the estimated lumens-density metric for the above exemplary embodiment in comparison to the estimated lumens-density metric for various prior art lighting modules.

| Module | $A_b$ (mm$^2$) | $A_{em}$ (mm$^2$) | $A_h$ (mm$^2$) | Lumens | LPW | LD |
|---|---|---|---|---|---|---|
| Exemplary Embodiment | 8,100 | 6.25 | 16,200 | 315 | 90 | $2.9 \times 10^6$ |
| OSTAR® (4 chip) model: LE W E2B | 355 | 4.41 | 42,480 | 200 | 50 | 1,525 |
| OSTAR® (6 chip) model: LE UW E3B | 355 | 6.72 | 42,480 | 300 | 50 | 985 |
| SONY LCD Backlight | 12,960 | 24.00 | 26,000 | 1,200 | 60 | $8.1 \times 10^5$ |
| TILUX (Gen. I) model: Tilux22-02 | 1,650 | 75.60 | 372,000 | 1,423 | 30 | 54.66 |
| TILUX (Gen. II) | 1,650 | 75.60 | 372,00 | 4,000 | 40 | 205 |
| TILUX (Gen. II) model: Tilux22-01 | | | | | | |

Figure 2:
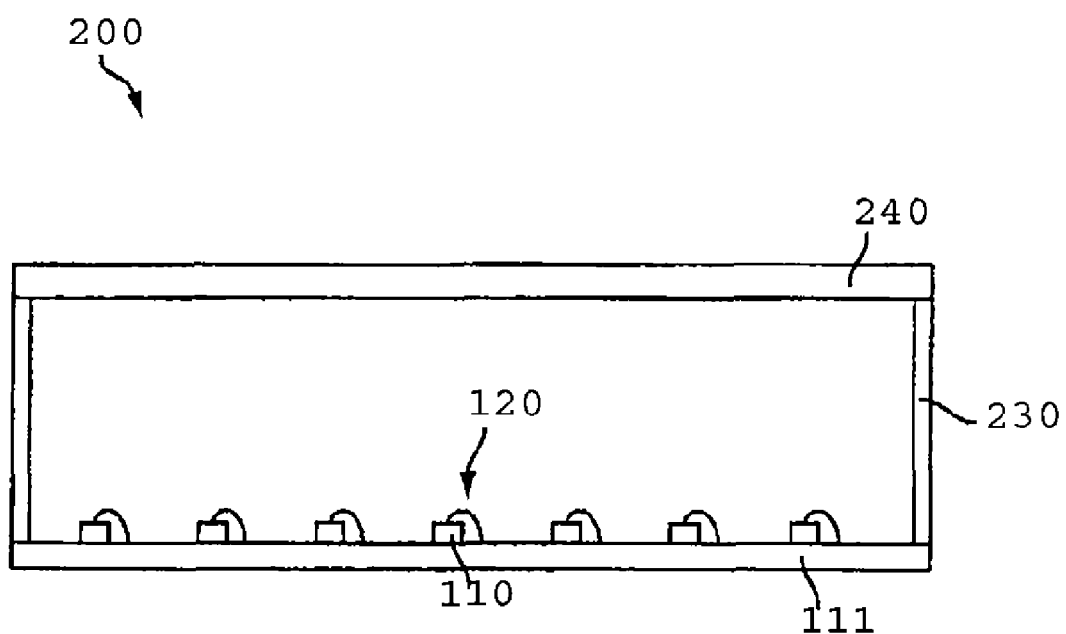
FIG. 2 shows a lighting module 200 in accordance with one embodiment.

FIG. 2 shows a side view of a lighting module 200 in accordance with one embodiment. As shown in FIG. 2, a plurality of LED chips 110 are directly attached to base panel 111 without standard LED packaging. LED chips 110 are in electrical communication with conductive traces (not shown) via wire bonds 120. While a wire bond technique is shown, other means of electrically coupling the LED chips 110 to an anode/cathode connection are within the province of one of skill in the art. For example, an alternative embodiment may use "flip-chip" technology to deliver current to LED chips.

Lighting module 200 includes a separator unit 230 to distance base panel 111 from a diffusion panel 240. Diffusion panel 240 serves as a means for diffusing the light emitted from the plurality of LED chips 110. As such a viewer of lighting module 200 does not see a pixilated array of chips, but instead sees a uniform light source. Diffusion panel 240 may also have phosphors embedded therein such that when blue/UV LED chips are used, the phosphors within diffusion panel 240 convert the blue/UV light into white light. In one embodiment, diffusion panel 240 may be coated with a phosphor or phosphor mixture. Alternatively, diffusion panel 240 may be dotted with phosphors or a phosphor mixture.

Figure 3:
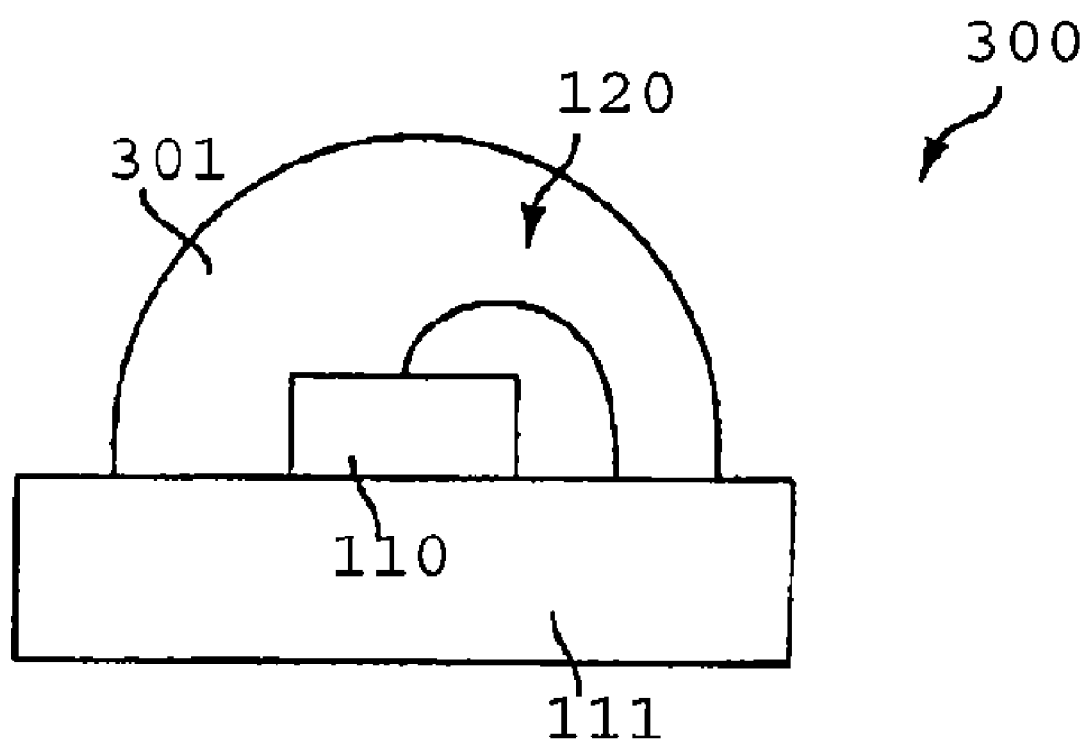
FIG. 3 shows a partial side view of an alternative lighting module arrangement.

FIG. 3 shows a partial side view of an alternative lighting module arrangement 300. As shown in FIG. 3, LED chip 110 is attached directly to base panel 111. LED chip 110 may be a blue/UV LED chip. The light emitted from LED chip 110 may then be converted to white light by covering LED chip 110 with a phosphor doped coating/material 301. In the embodiment shown, coating 301 takes the form of a "bubble" covering LED chip 110. In an alternative embodiment, coating 301 may simply cover a surface, or a portion, of LED chip 110.

Figure 4:
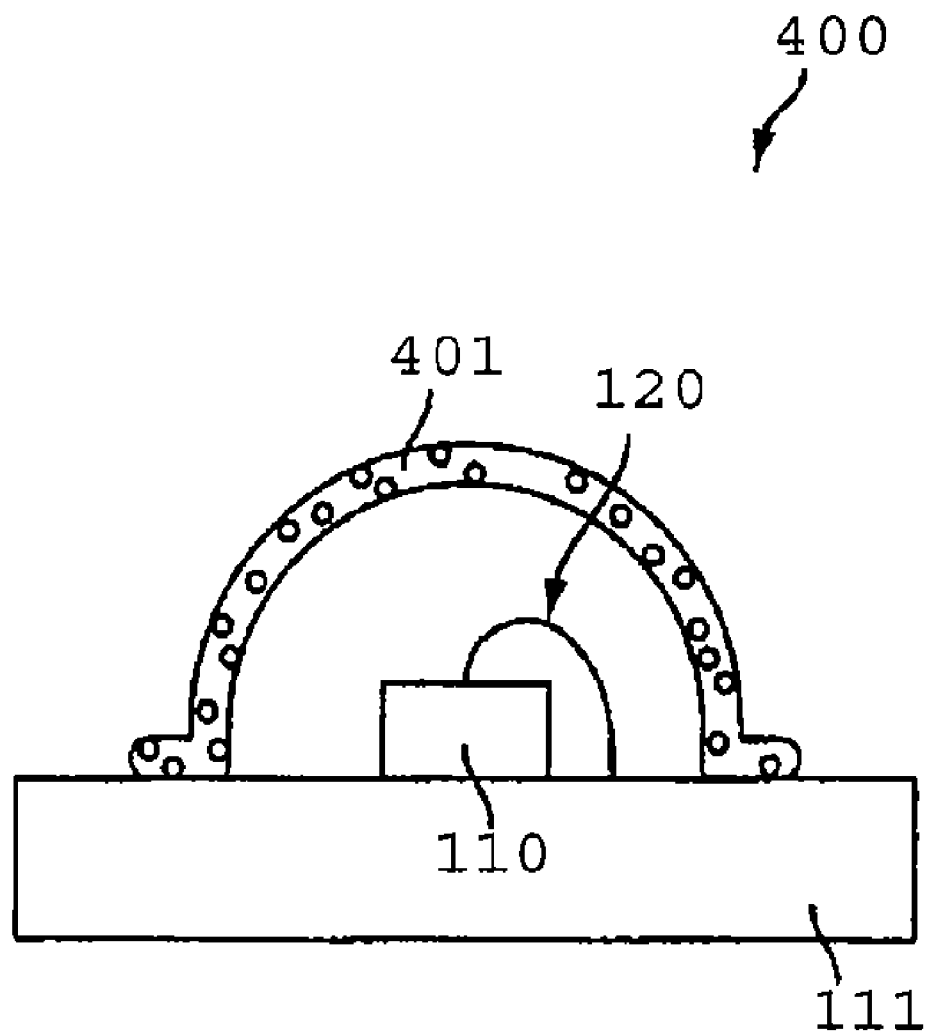
FIG. 4 shows a partial side view of an alternative lighting module arrangement.

FIG. 4 shows a partial side view of an alternative lighting module arrangement 400. As shown in FIG. 4, LED chip 110 is attached directly to base panel 111. LED chip 110 may be a blue/UV LED chip. The light emitted from LED chip 110 is then converted into white light by attaching a phosphor-doped dome 401 to base panel 111, directly over LED chip 110.

Figure 5:
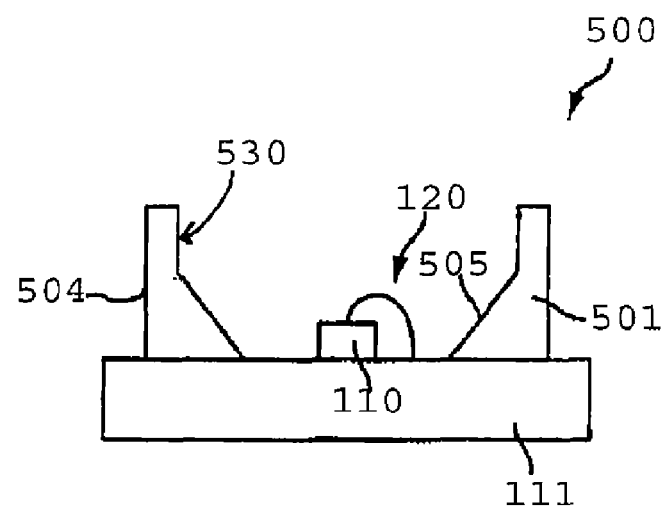
FIG. 5 shows a partial side view of an alternative lighting module arrangement.
Figure 6:
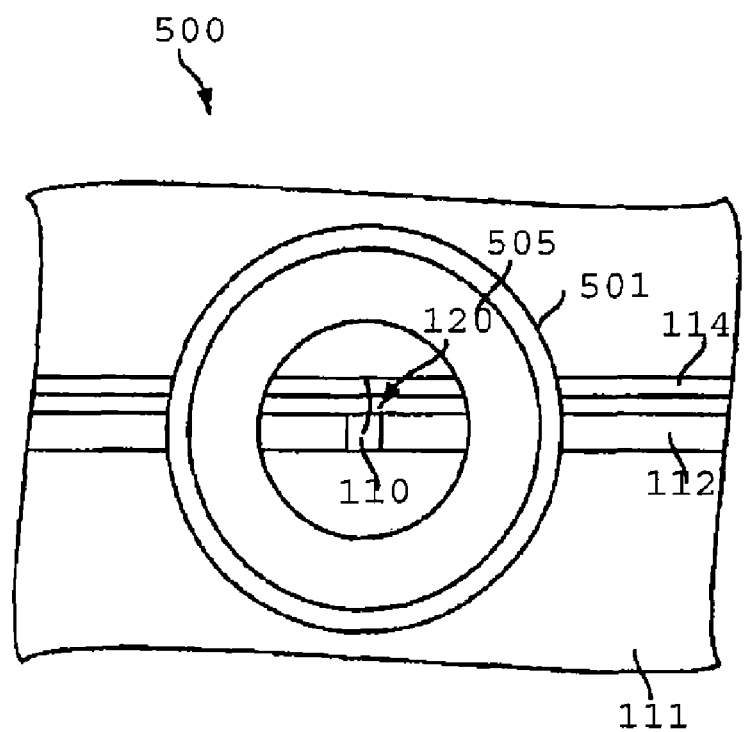
FIG. 6 shows a partial plan view of the lighting module arrangement of FIG. 5.
Figure 10:
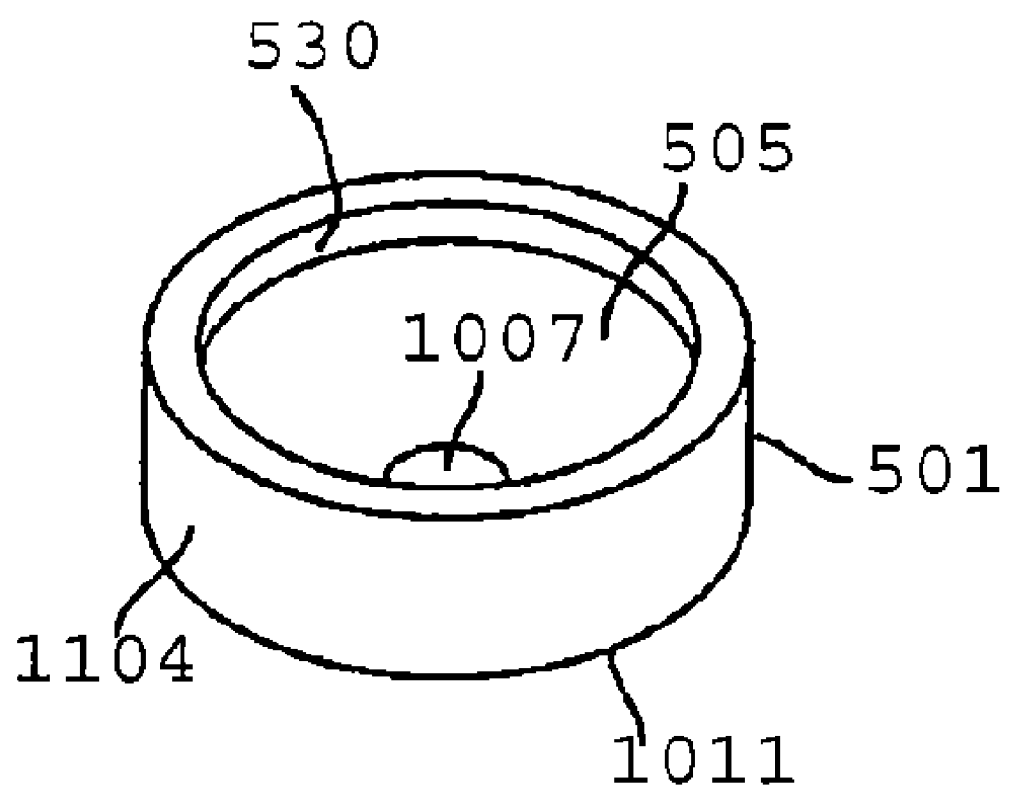
FIG. 10 shows a perspective view of an optical cup.
Figure 11A:
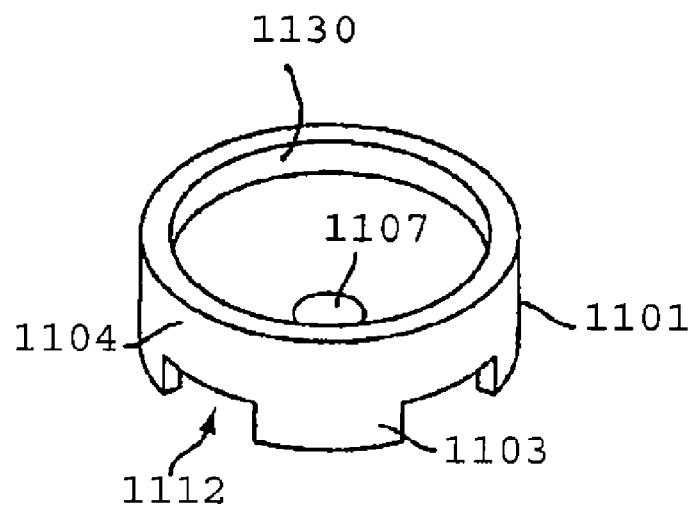
FIG. 11A shows a perspective top view of an alternative optical cup.
Figure 11B:
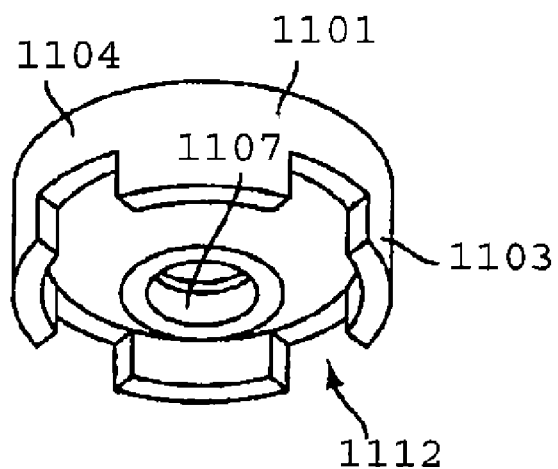
FIG. 11B shows a perspective bottom view of the optical cup of FIG. 11A.

FIG. 5 shows a partial side view of an alternative lighting module arrangement 500. FIG. 6 shows a partial plan view of lighting module arrangement 500. LED chip 110 is directly attached to base panel 111 such that LED chip 110 is in electrical communication with first and second conductive traces 112, 114 via wire bond 120. An optical cup 501 is then attached to base panel 111 so as to surround LED chip 110. Optical cup 501 is formed of an upwardly extending peripheral wall 504 and a slanted inner surface 505. In one embodiment, optical cup 501 is coated with a reflective coating on inner surface 505. In an alternative embodiment, optical cup 501 may itself be formed of a reflective material to avoid the need for a reflective coating. Optical cup 501 also includes a lip region 530. Optical cup 501, and equivalent structures, serve as means for redirecting the light emitted from LED chip 110. As discussed below, FIGS. 10, 11A, and 11B show various views of alternative optical cups 501 and 1101, respectively.

Figure 7:
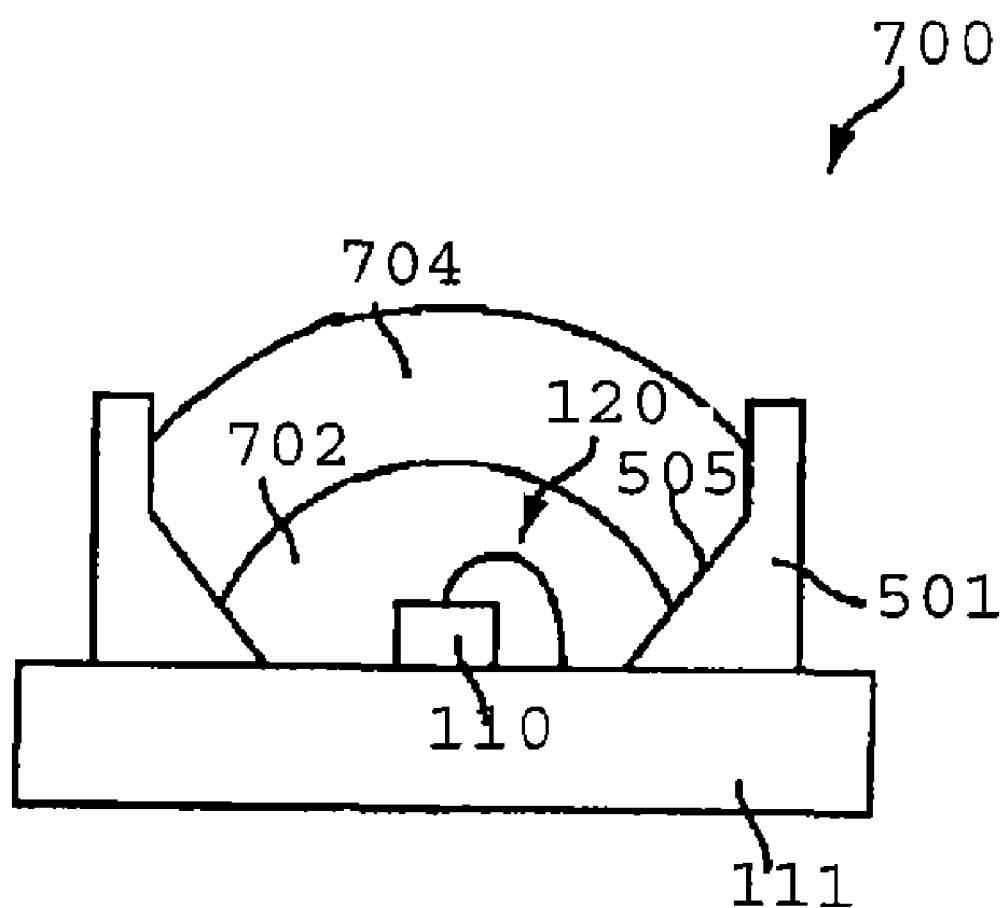
FIG. 7 shows a partial side view of an alternative lighting module arrangement.

FIG. 7 shows a partial side view of an alternative lighting module arrangement 700. LED chip 110 is directly attached to base panel 111. Optical cup 501 is mounted on base panel 111 so as to surround LED chip 110. In the embodiment shown in FIG. 7, at least one layer of a transparent material is disposed within optical cup 501. For example, a first silicone layer 702 is disposed over LED chip 110. As shown, a second silicone layer 704 may then be applied over first silicone layer 702. If a blue/UV LED is employed, such layers may be used to convert the light emitted from LED chip 110 to white light using phosphors.

Figure 8:
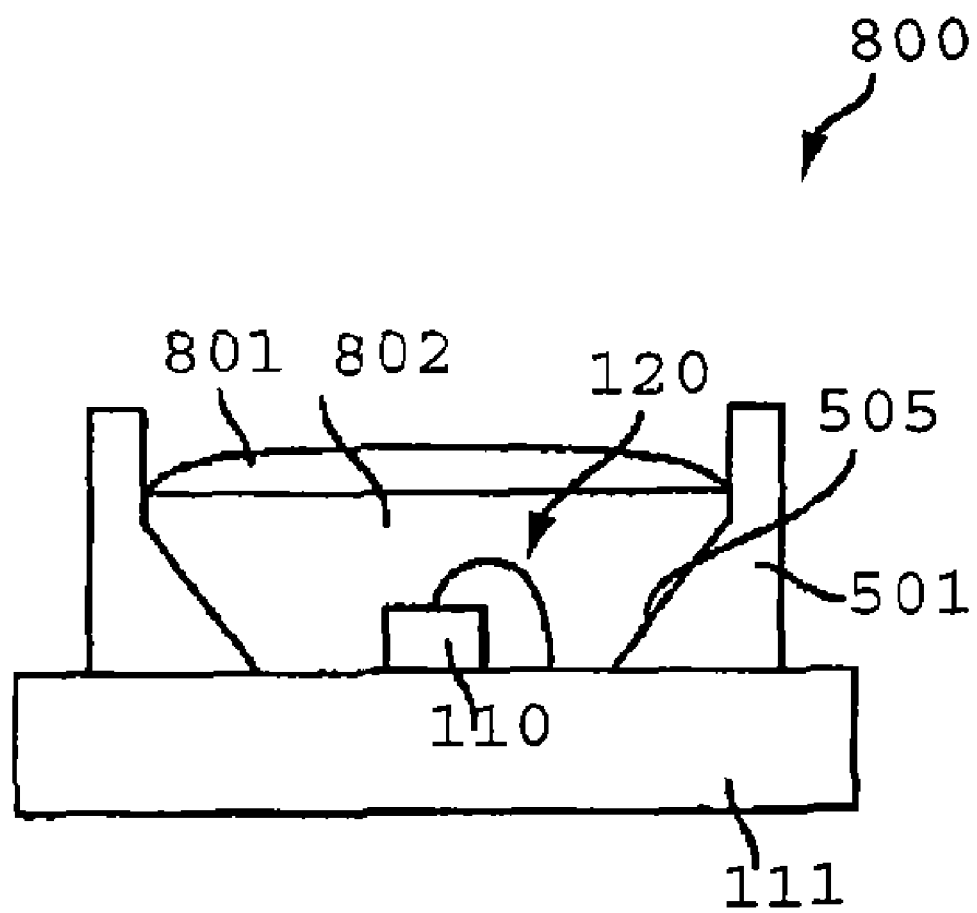
FIG. 8 shows a partial side view of an alternative lighting module arrangement.

FIG. 8 shows a partial side view of an alternative lighting module arrangement 800. As shown in FIG. 8, LED chip 110 is directly attached to base panel 111. Optical cup 501 surrounds LED chip 110. An optical disk 801 is disposed within optical cup 501.

Optical disk 801 may be used to convert the light emitted from the LED chip 110 to white light. For example, optical disk 801 may be phosphor-doped so as to convert light emitted from a blue/UV LED chip 110 to white light. As such, optical disk 801, and equivalent structures, serve as means for remote phosphor conversion of the light emitted from the LED chip. Optionally, a silicone or adhesive is disposed within area 802 between optical disk 801 and LED chip 110.

Figure 9:
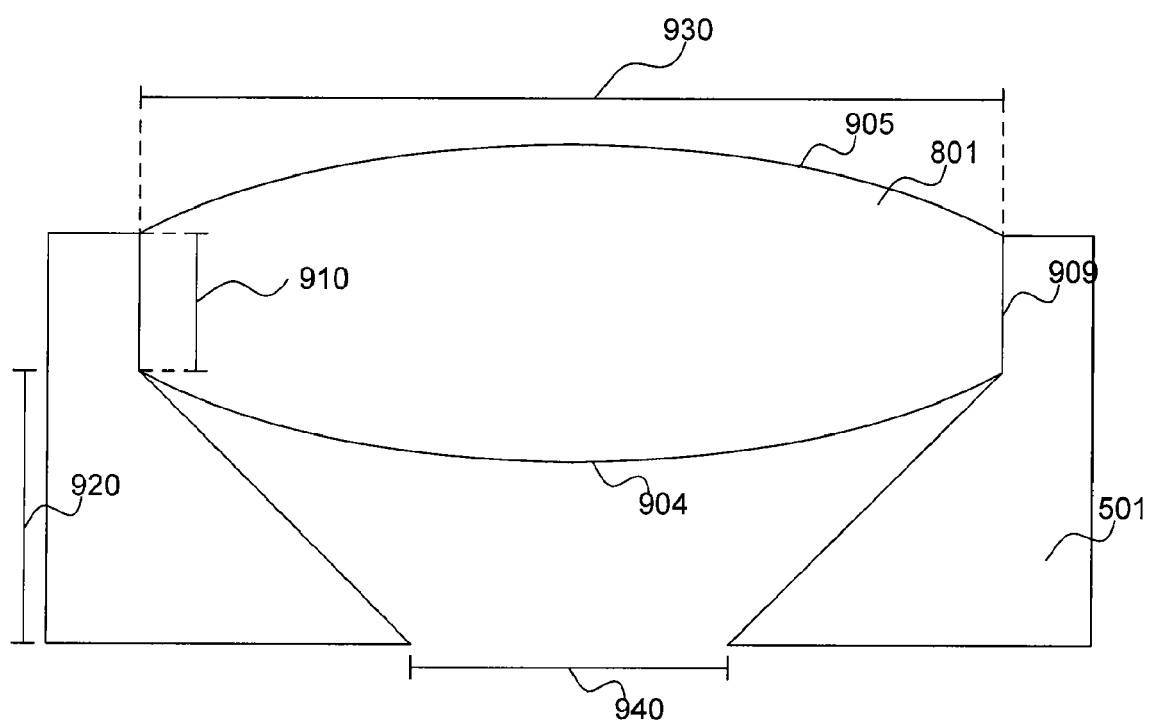
FIG. 9 shows a side view of the optical disk of FIG. 8.

FIG. 9 shows a side view of optical disk 801 disposed within optical cup 501. Optical disk 801 is comprised of a lower surface 904 and an upper surface 905. Lower and/or upper surfaces 904, 905 are tapered such that a center area of optical disk 801 has a greater width than a width 910 of a perimeter surface 909 of optical disk 801. Surfaces 904, 905 may be modified so as to be convex, plano-convex, or meniscus. Optical disk 801 may also be phosphor-doped to thereby serve as means for remote phosphor conversion of the light emitted from the LED chip. In operation, light rays from LED chip 110 are transmitted through optical disk 801 such that each ray has a substantially similar path length through optical disk 801; preferably the path lengths do not differ by more than one percent.

Optical disk 801 is designed for the uniform conversion of blue/UV light over the surface area of the disk. Phosphors are generally used to convert blue/UV light to white light. The conversion process, and specifically the amount of phosphor that the blue/UV light interacts with, determines the efficiency of the light extraction. If too little phosphor is used, the resultant light is of a lower flux, and there is substantial unconverted blue/UV light present, which lowers the overall efficiency of the conversion process. If too much phosphor is used, the converted light will be too yellow. Further, the light emission from a standard surface emitting blue/UV LED chip is not the same in all directions. For example, the light intensity is peaked in the forward direction. If the LED chip is encapsulated by a uniform thickness of phosphor, the resultant light will not be uniformly white. This effect is commonly seen in commercially available packaged LEDs. The shape of optical disk 801 addresses this problem.

For example, the shape of optical disk 801 may be configured such that the absorption path length of the blue/UV light is about the same in all directions. The non-uniform thickness of optical disk 801 results in a relatively uniform white light distribution, better color control, and/or higher overall efficiency of LED chip 110. With reference to FIG. 9, the dimensions for consideration are: the end thickness 910 of optical disk 801; the inner height 920 of optical cup 501; the diameter 930 of optical disk 801; the central opening diameter 940 of optical cup 501; the LED chip height (not numbered); the LED width (not numbered); and/or the radius of curvature (not numbered) of optical disk 801. The phosphor loading of optical disk 801 can be between 0.5 weight percent and ten weight percent. In one embodiment, optical disk 801 is a phosphor-doped liquid silicone rubber, such as, for example, LSR-70.

FIG. 10 shows a perspective view of optical cup 501. As shown in FIG. 10, optical cup 501 includes a central opening 1007. When optical cup 501 is glued to base panel 111, bubbles may form on the lower surface 1011 of optical cup 501. FIG. 11A shows a perspective top view of an alternative optical cup 1101. FIG. 11B shows a perspective bottom view of optical cup 1101. At least one cut out 1112 is formed along peripheral wall 1104 of cup 1101, forming legs 1103. Cut outs 1112 allow air to flow and ventilates cup 1101. As such, bubbles do not get trapped under optical cup 1101. The structure of optical cup 1101 serves as means for minimizing bubble formation on the bottom surface of the optical cup.

Phosphors

As mentioned above, to produce a white light, as needed for general lighting applications, a blue/UV LED chip may be employed in combination with a phosphor disposed in the light path of the LED chip. The blue/UV light emitted from the LED chip excites the phosphor, and the cumulative effect of the emitted light and phosphor excitation produces white light. Several blue/UV LED chip and phosphor combinations may be employed. Provided below are chip/phosphor combinations that may be employed in any of the embodiments provided herein. The combinations provided are merely examples and are not exhaustive. Other combinations are within the province of one of skill in the art. For example, U.S. Pat. Nos. 7,224,000 and 7,176,502, which are hereby incorporated by reference in their entirety, disclose other chip and phosphor combinations.

For example, a blue LED and yellow YAG:Ce emitting phosphor may be used in one exemplary embodiment. In alternative embodiments, the following combinations may be employed: blue LED chips and TAG:Ce phosphor; deep UV emitting LED chip (emitting from about 230-270 nm) with red emitting $Y_2O_3$:Eu phosphor; deep UV emitting LED chip with green emitting $La(PO_4)$:Ce or $(Ce,Tb)MgAl_xO_y$:Ce, Tb or $ZnSiO_4$:Mn phosphor; deep UV emitting LED chip with blue emitting $BaMg_xAl_yO_z$:Eu or $Sr(Cl)(PO_4)_3$:Eu phosphor. In alternative embodiments, the blue light from a blue LED chip is mixed with green, yellow and red phosphor emissions to generate white light. The phosphor layer completes the emission spectrum, with yellow and red components, to generate white light of a desired color temperature.

The particle size of phosphors for the LED light excitation is typically in the range of about 1-10 microns. Particle sizes larger than 10 microns may also be employed.

The scattering due to smaller particle sizes becomes stronger and increases the amount of blue light reflected back towards the chip—with the additional complication of decreasing the quantum efficiencies for small size (e.g. nano-) phosphors. Phosphor coating thickness is typically in 5-100 micron range, and preferably between 10-30 micron. The range depends on the particle size and activator concentration of each component used, as well as on the desired result in terms of CCT and CRI, which are directly influenced by the amount of non-absorbed blue light.

Methods

Figure 12:
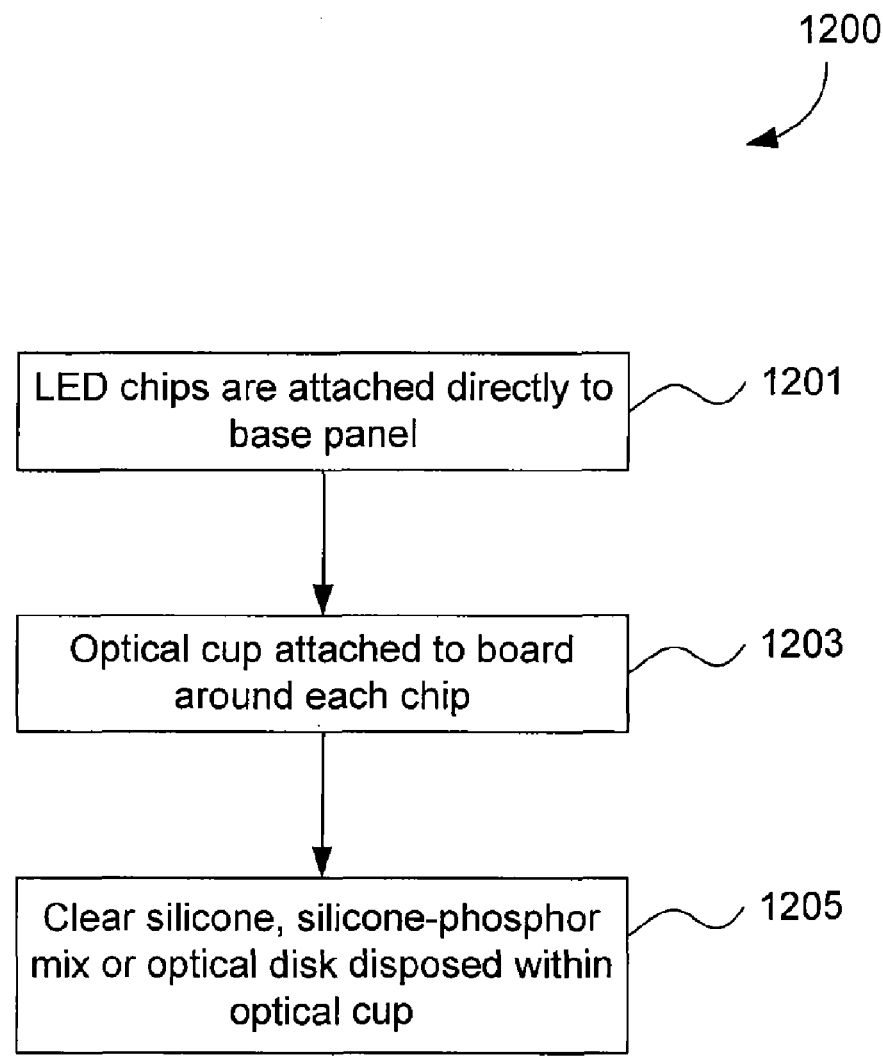
FIG. 12 shows a flowchart illustrating a method of creating a lighting module in accordance with the present invention.

FIG. 12 shows a flowchart illustrating a method 1200 of creating a lighting module in accordance with an embodiment of the present invention. Method 1200 begins with step 1201 wherein LED chips are attached directly onto a base panel so as to be in electrical communication with conductive traces. In step 1203, an optical cup is attached to the board around each LED chip. In step 1205, the optical cup is filled with a clear silicone or silicone-phosphor mix. In an alternative embodiment, instead of or in addition to filling the optical cup with a clear silicone mix, an optical disk as shown in FIGS. 8 and 9 may be disposed within the optical cup.

Figure 14:
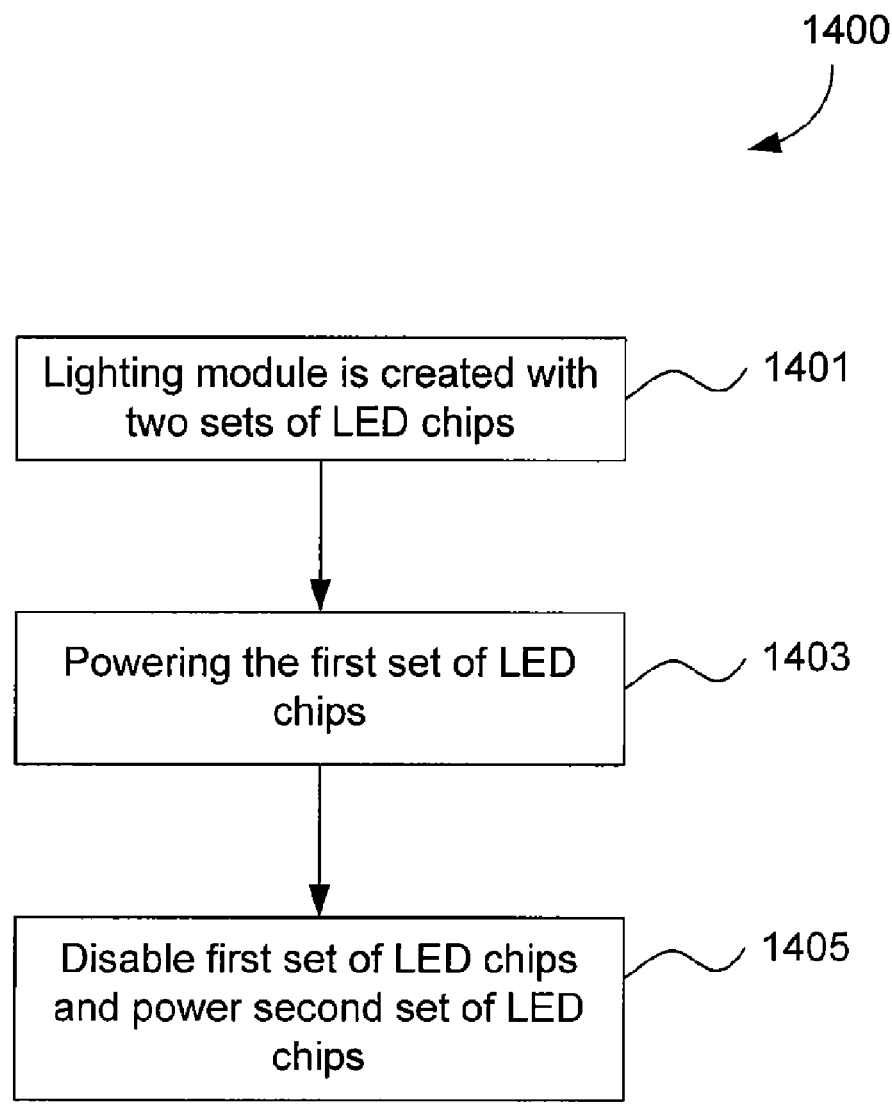
FIG. 14 illustrates a method for servicing a client using any of the lighting modules described herein.

FIG. 14 shows a flowchart illustrating a method 1400 for servicing a client using any of the lighting modules described herein. In step 1401, a lighting module is created in accordance with one of the structural embodiments described above. The lighting module is populated with a first and second set of LED chips. In step 1403, the first set of LED chips is powered. The second set of LED chips is set up such that the second set does not activate with the first set. The second set of chips is only activated when the first array of chips fails or blows out. In step 1405, a servicer disables the first set of LED chips and powers the second set of LED chips. A manufacturer who sells such a system can thereby deliver one system that effectively provides a "double lifetime" because when the first set of LED chips fails, a servicer can activate the second set of LED chips without replacing the entire system. The second set of chips may also serve as an emergency lighting system if the first set of chips fails unexpectedly.

INDUSTRIAL APPLICABILITY

In operation, the lighting modules presented herein may be distributed and sold as LED lamps for general lighting applications. Attachment means such as bolts, screws, clamps, glues, rivets, and other attachment means may be employed to attach the lighting modules to any given lighting fixture for any given lighting application.

EXAMPLES

The following paragraphs serve as examples of the above-described systems. The examples provided are prophetic examples, unless explicitly stated otherwise.

Example 1

In one example, a lighting module is provided with a plurality of rectangular LED chips (260 μm×450 μm) attached to a base panel. The LED chips generally have a rated current of about 20 mA and a forward voltage of about 3.2V. In operation, a forward current (de-rated current) of 14 mA is delivered to the LED chips. As such, the input power per chip is about 0.064 W. The design pack-density for this example is about four chips per square inch. The board temperature for such example is about 56° C. Such example also has the added advantage of increased chip efficiency due to driving the chips at a lower current because the efficiency of an LED chip increases with decreasing current. For example, the efficiency of a 260 μm×450 μm chip driven at a de-rated current of 14 mA is about 30% (i.e., 30% of the input power is converted to light with the remaining 70% is heat), while the efficiency of the same chip driven at its rated current of 20 mA is about 27%. As such, by de-rating the chip, heat is decreased by reduced input power and higher efficiency.

Example 2

In another example, a lighting module is provided with a plurality of square LED chips (500 μm×500 μm) attached to a base panel. The LED chips generally have a rated current of about 150 mA and a forward voltage of about 3.2V. In operation, the chips are driven at a de-rated current of about 45 mA. The design pack-density of such lighting module is about one chip per square inch.

Example 3

In another example, a lighting module is provided with 63 LED chips die bonded to a printed circuit board (equally spaced, i.e., nine rows of seven chips). A reflective optical cup is then placed around each chip and filled with a phosphor loaded silicone (i.e., 1-2 wt. percent phosphor). A shaped optical disk is then placed on top of the optical cup. The disk is designed to fit within the cup but not contact the wire bond or chip. In an alternative embodiment, two or more LED chips are disposed within each cup.

Such a lighting module combines the thermal advantages of chip-on-board (COB) LED construction with the enhanced light extraction of packaged discrete LED construction to form a 2D LED array lighting module. The lighting module is built with a 2D array of chips die-bonded to a printed circuit board with optical cups, silicone, phosphor conversion, and optics built around the individual chips.

Example 4

The table below provides sample dimensions and specifications for optical disk 801 and optical cup 501.

| Example | LED chip width (mm) | Optical disk end thickness (mm) | Optical cup inner height (mm) | Diameter of optical disk (mm) | Radius of curvature of optical disk (mm) | Diameter of hole in optical cup (mm) |
|---|---|---|---|---|---|---|
| 1 | 0.5 | 1.0 | 1.7 | 3.0 | 9.0 | 1.0 |
| 2 | 0.5 | 0.5 | 1.7 | 3.0 | 13 | 1.0 |
| 3 | 0.5 | 2.0 | 1.7 | 3.0 | 8.5 | 1.0 |

Example 5

Figure 15A:
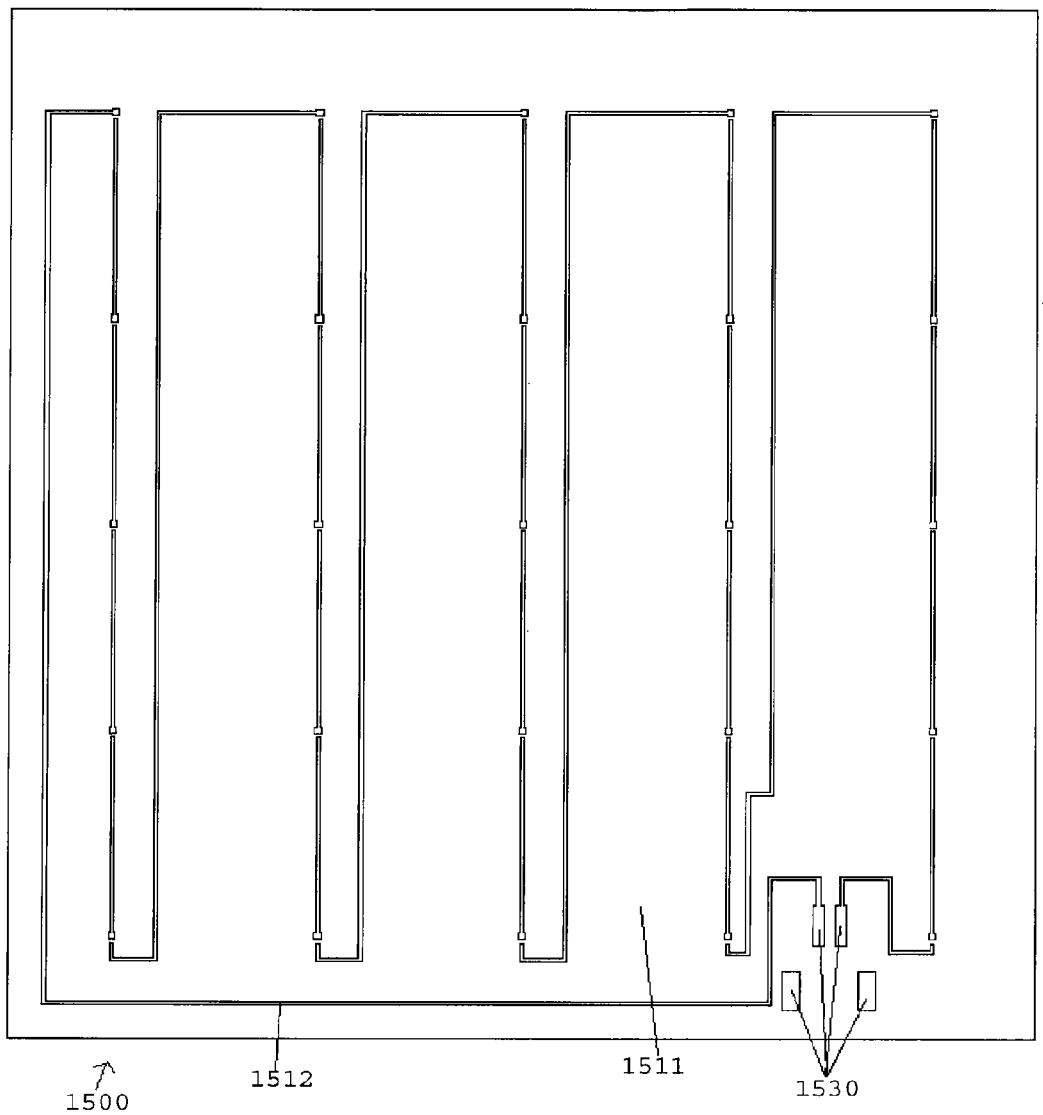
FIGS. 15A-15C provide illustrations supporting another embodiment presented herein.
Figure 15B:
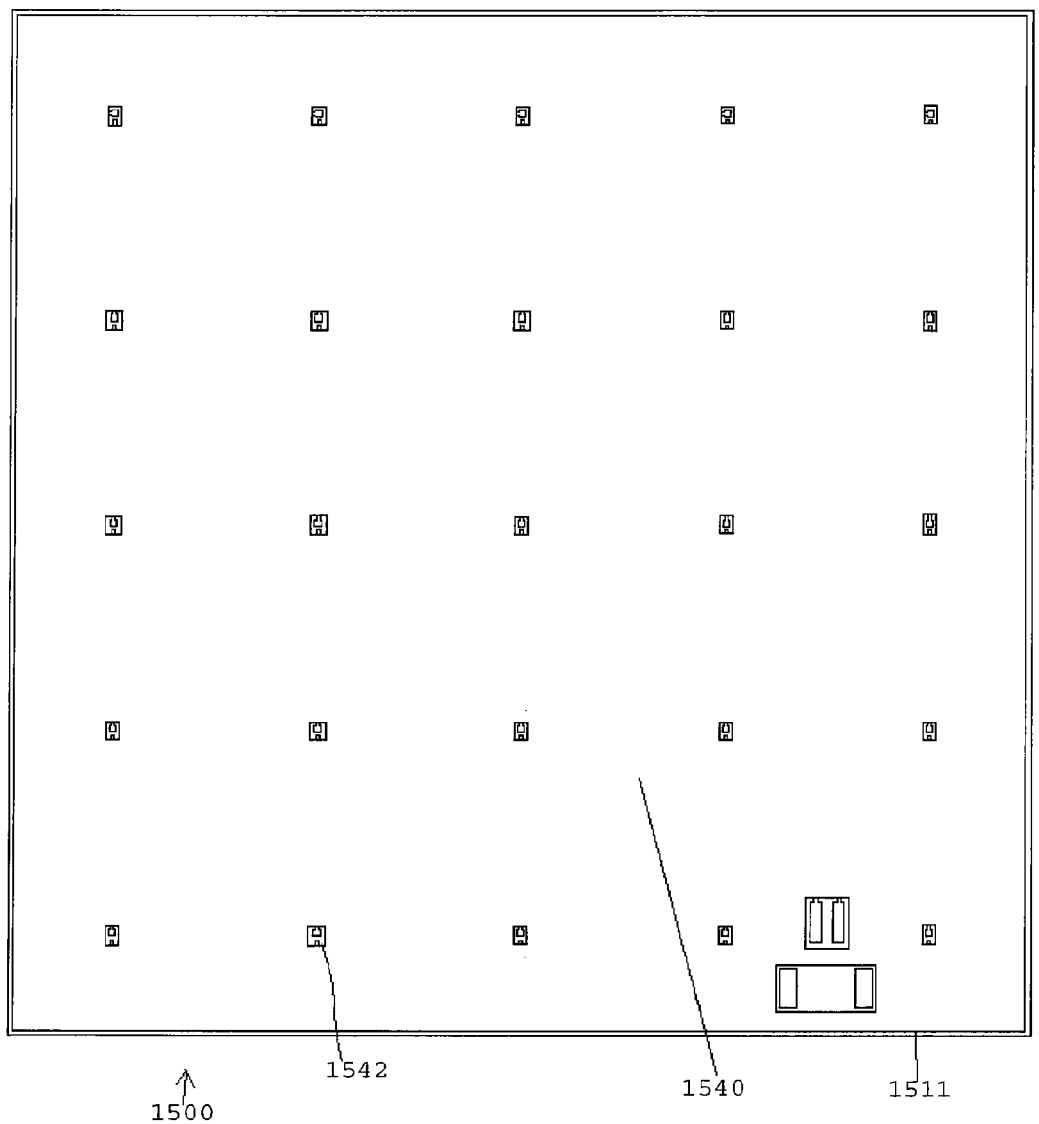
Figure 15C:
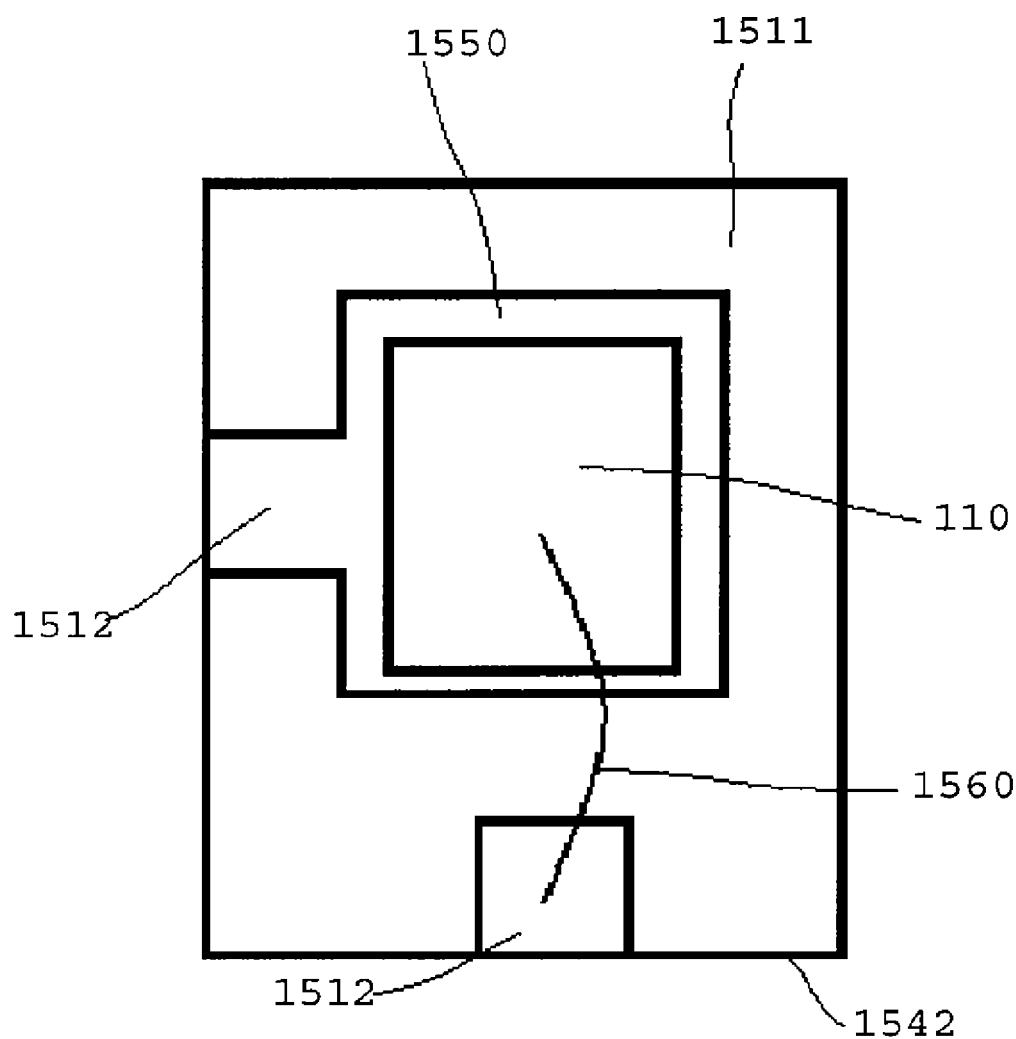

FIGS. 15A-15C provide illustrations supporting another embodiment presented herein. Specifically, FIGS. 15A-15C illustrate the iterative steps of preparing a lighting module 1500. First, a base panel 1511 is provided. Base panel 1511 may be a printed circuit board such as an aluminum board having an insulative layer disposed on one surface. Conductive traces 1512 are applied on the insulative layer. Conductive traces 1512, shown in FIG. 15A, differ from the conductive traces 112, 114 of FIG. 1 in that conductive traces 1512 present a serial circuit for current delivery to the LED chips. Leads 1530 are provided for electrical connection of conductive traces 1512 to a surface mounted connector (not shown). The surface mounted connector is then connected to a power source for delivery of current to conductive traces 1512. The power source may be a DC power supply or an AC power supply in combination with an AC/DC converter and/or current regulator.

As illustrated in FIG. 15B, base panel 1511 is covered with a mask 1540 (i.e., a solder mask). Mask 1540 includes a plurality of openings 1542 to expose necessary portions of conductive traces 1512. In other words, mask 1540 serves to cover portions of conductive traces 1512 that do not need to be exposed. As shown in FIG. 15C, LED chips 110 are then secured to die bond areas 1550 of conductive traces 1512. The circuit is then closed by a wire bond 1560 between the individual LED chips 110 and the proximate conductive trace 1512. The above-presented optical cups 501, 1101 and/or optical disks 801 may be adhered to lighting module 1500.

In the example presented, lighting module 1500 comprises 25 LED chips sized at about 500 μm by about 500 μm. A current of about 50 mA is delivered to lighting module 1500, with a voltage of about 80+/−7.5V. Therefore, each chip receives a forward current of about 50 mA and a forward voltage of about 3.2+/−0.3V. If lighting module 1500 were arranged in parallel, the 25 LED chips would require a voltage of about 3.2V and a forward current of about 1.25 A to be shared amongst the chips. Each LED chip is generally spaced about 18 mm from the nearest LED chip.

CONCLUSION

It is to be appreciated that the Detailed Description section, and not the Brief Summary of the Invention, Examples, and Abstract sections, is intended to be used to interpret the claims. The Brief Summary of the Invention, Examples, and Abstract sections may set forth one or more but not all exemplary embodiments of the present invention as contemplated by the inventor(s), and thus, are not intended to limit the present invention and the appended claims in any way.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A lighting module comprising:
a base panel; and
a plurality of light-emitting diode chips attached directly to the base panel in electrical communication with a conductive trace;
wherein at least a portion of the base panel has a lumens-density metric greater than $1.0 \times 10^6$ lm$^2$/mm$^2$W.

2. The lighting module of claim 1, wherein the plurality of light-emitting diode chips include chips having a width of less than about 600 microns and a length of less than about 600 microns.

3. The lighting module of claim 1, wherein the plurality of light-emitting diode chips include chips having a width of less than about 300 microns and a length of less than about 475 microns.

4. The lighting module of claim 1, further comprising:
a power source coupled to the conductive trace.

5. The lighting module of claim 1, further comprising a plurality of cups, wherein each cup encircles a chip.

6. The lighting module of claim 1, wherein a at least one chip includes phosphor-doped coating.

7. The lighting module of claim 1, further comprising phosphor-doped dome disposed over at least one chip.

8. The lighting module of claim 1, wherein the lumens-density metric is greater than $2.0 \times 10^6$ lm$^2$/mm$^2$W.

9. The lighting module of claim 1, wherein the lumens-density metric is about $2.9 \times 10^6$ lm$^2$/mm$^2$W.

10. The lighting module of claim 4, wherein at least one of the plurality of light-emitting diode chips has a rated current, and wherein the power source is adapted to deliver a drive current of less than about 75% of the rated current.

11. The lighting module of claim 4, wherein at least one of the plurality of light-emitting diode chips has a rated current, and wherein the power source is adapted to deliver a drive current of less than about 50% of the rated current.

12. The lighting module of claim 4, wherein the plurality of light-emitting diode chips include chips having a width of about 260 microns, a length of about 450 microns, and a rated current of about 20 milli-amperes.

13. The lighting module of claim 12, wherein the power source is adapted to deliver a drive current equal to or less than about 14 milli-amperes.

14. The lighting module of claim 5, wherein at least one cup has a reflective coating.

15. The lighting module of claim 5, wherein at least one cup includes a ventilation opening.

16. The lighting module of claim 5, wherein at least one cup has a phosphor-doped mixture disposed therein.

17. The lighting module of claim 5, further comprising a phosphor-doped disk disposed within at least one cup.

18. The lighting module of claim 17, wherein the phosphor-doped disk is at least partially formed of silicone.

19. The lighting module of claim 17, wherein the phosphor-doped disk is formed of LSR-70.

20. A lighting module comprising:
a base panel; and
wherein an area of the base panel about four inches wide and about four inches long includes about twenty-five light-emitting diode chips attached directly to the base panel in electrical communication with a conductive trace, wherein each light-emitting diode chip is about 500 μm wide by about 500 μm long; and
a power source delivering a forward voltage of about 3.2+/−0.3 volts;
wherein at least a portion of the base panel has a lumens-density metric greater than $2.0 \times 10^6$ lm$^2$/mm$^2$W.

21. A lighting module comprising:
a base panel; and
wherein an area of the base panel about four inches wide and about four inches long includes about twenty-five light-emitting diode chips attached directly to the base panel in electrical communication with a conductive trace, wherein each light-emitting diode chip is about 500 μm wide by about 500 μm long; and
a power source delivering a rated current of about 0.080+/−0.010 amperes;
wherein at least a portion of the base panel has a lumens-density metric greater than $2.0 \times 10^6$ lm$^2$/mm$^2$W.

22. A method of preparing a lighting module, comprising:
attaching a plurality of light-emitting diode chips to a base panel in accordance with a lumens-density metric of greater than $1.0 \times 10^6$ lm$^2$/mm$^2$W; and
coupling the light-emitting diode chips to a conductive trace.

23. The method of claim 22, wherein the lumens-density metric is greater than $2.0 \times 10^6$ lm$^2$/mm$^2$W.

24. The method of claim 22, wherein the lumens-density metric is about $2.9 \times 10^6$ lm$^2$/mm$^2$W.

25. The method of claim 22, further comprising:
coupling the conductive trace to a power source; and
adapting the power source to deliver a de-rated current to the plurality of light-emitting diode chips.

26. A lighting module comprising:
a base panel;

a plurality of conductive traces disposed on the base panel; and a plurality of light-emitting diode chips in electrical communication with the conductive traces and arranged in a serial configuration;

wherein at least a portion of the base panel has a lumens-density metric greater than $1.0 \times 10^6$ $lm^2/mm^2W$.

27. The lighting module of claim 26, further comprising:

a power source coupled to at least one of the conductive traces.

28. The lighting module of claim 27, wherein the plurality of light-emitting diode chips include chips having a width of about 500 μm and a length of about 500 μm.

29. The lighting module of claim 28, wherein the power source delivers about 50 mA of current to plurality of light-emitting diode chips.

30. A lighting module comprising:

a base panel; and an 18 mm by 18 mm section of the base panel including four light-emitting diode chips, wherein each light-emitting diode chip is about 500 μm wide and about 500 μm long and is in electrical communication a conductive trace in a serial configuration; and a current source delivering about 50 mA of current to the light-emitting diode chips;

wherein at least a portion of the base panel has a lumens-density metric greater than $1.0 \times 10^6$ $lm^2/mm^2W$.

* * * * *